(12) United States Patent
Hu et al.

(10) Patent No.: US 12,410,828 B2
(45) Date of Patent: Sep. 9, 2025

(54) STRUCTURE WITH SCREW, SCREW FIXING STRUCTURE AND DISPLAY DEVICE

(71) Applicant: Wuhu Tianma Automotive Electronics Co., Ltd., Wuhu (CN)

(72) Inventors: Zhijun Hu, Wuhu (CN); Hui Yang, Wuhu (CN); Wenyi Yin, Wuhu (CN)

(73) Assignee: Wuhu Tianma Automotive Electronics Co., Ltd., Wuhu (CN)

( * ) Notice: Subject to any disclaimer, the term of this patent is extended or adjusted under 35 U.S.C. 154(b) by 167 days.

(21) Appl. No.: 18/534,791

(22) Filed: Dec. 11, 2023

(65) Prior Publication Data

US 2024/0110585 A1  Apr. 4, 2024

(30) Foreign Application Priority Data

Sep. 6, 2023 (CN) .......................... 202311149607.1

(51) Int. Cl.
*F16B 5/02* (2006.01)
*H05K 5/02* (2006.01)

(52) U.S. Cl.
CPC ......... *F16B 5/0258* (2013.01); *H05K 5/0217* (2013.01)

(58) Field of Classification Search
CPC ...... F16B 5/0258; F16B 35/041; F16B 35/06; F16B 39/28; F16B 39/284; H05K 5/0217
See application file for complete search history.

(56) References Cited

U.S. PATENT DOCUMENTS

| | | | | |
|---|---|---|---|---|
| 2020/0271151 | A1* | 8/2020 | Hsu | F16B 25/0068 |
| 2021/0108668 | A1* | 4/2021 | Nill | F16B 37/127 |
| 2021/0362435 | A1* | 11/2021 | Tuncer | F16B 35/06 |
| 2022/0154757 | A1* | 5/2022 | Zhang | F16B 35/06 |
| 2023/0302527 | A1* | 9/2023 | Layman | F16B 5/0241 |
| 2023/0366190 | A1* | 11/2023 | Schuster | F16B 35/06 |

FOREIGN PATENT DOCUMENTS

| | | |
|---|---|---|
| CN | 104632819 A | 5/2015 |
| CN | 106660514 A | 5/2017 |

* cited by examiner

*Primary Examiner* — Pegeman Karimi
(74) *Attorney, Agent, or Firm* — KDW FIRM PLLC

(57) ABSTRACT

Provided are a structure with a screw, a screw fixing structure and a display device. The structure with a screw includes a limiting structure, an assembly member, an elastic member and a screw, the limiting structure is connected to the assembly member and provided with an operating hole, the assembly member is provided with a through hole for accommodating the screw and the elastic member, an abutting step is provided in the through hole, an end of the elastic member abuts against the abutting step and the other end of the elastic member abuts against the screw, a head portion of the screw has an operating portion and an abutting portion, the abutting portion abuts against the limiting structure, and the operating portion is exposed through the operating hole.

21 Claims, 7 Drawing Sheets

000# STRUCTURE WITH SCREW, SCREW FIXING STRUCTURE AND DISPLAY DEVICE

CROSS-REFERENCE TO RELATED APPLICATION(S)

This application claims priority to Chinese Patent Application No. 202311149607.1 filed with the China National Intellectual Property Administration (CNIPA) on Sep. 6, 2023, the disclosure of which is incorporated herein by reference in its entirety.

TECHNICAL FIELD

The present disclosure relates to the field of assembly technology and, in particular, to a structure with a screw, a screw fixing structure and a display device.

BACKGROUND

A product to be assembled with a screw needs to be additionally equipped with the screw. As a separate part, the package and transportation of the screw require an additional cost, and the screw is easy to lose. Moreover, during the subsequent assembly, the package of the screw needs to be unwrapped and the screw needs to be taken out, resulting in low assembly efficiency.

In the related art, the scheme of a pre-assembled screw is used. However, within a limited mounting space, the pre-assembled screw cannot return to an original pre-assembly position after detached and is difficult to repeatedly assemble.

SUMMARY

The present disclosure provides a structure with a screw, a screw fixing structure and a display device, so as to pre-assemble a screw and enable the screw to return to a pre-assembly position after detached so that the screw can be repeatedly assembled.

The present disclosure provides a structure with a screw, including a limiting structure, an assembly member, an elastic member and a screw. The limiting structure is connected to the assembly member and provided with an operating hole, the assembly member is provided with a through hole for accommodating the screw and the elastic member, an abutting step is provided in the through hole, an end of the elastic member abuts against the abutting step and the other end of the elastic member abuts against the screw, a head portion of the screw has an operating portion and an abutting portion, the abutting portion abuts against the limiting structure, and the operating portion is exposed through the operating hole.

The present disclosure provides a screw fixing structure, including a limiting structure, an assembly member, an elastic member and a screw. The limiting structure is connected to the assembly member and provided with an operating hole, the assembly member is provided with a through hole for accommodating the screw and the elastic member, an abutting step is provided in the through hole, an end of the elastic member abuts against the abutting step and the other end of the elastic member abuts against the screw, a shank portion of the screw is connected to a to-be-assembled member, and a head portion of the screw has an operating portion and an abutting portion.

When the shank portion of the screw is disconnected from the to-be-assembled member, the elastic member pushes the screw towards the limiting structure so that the abutting portion abuts against the limiting structure, and the operating portion is exposed through the operating hole.

The present disclosure provides a display device, including a display panel, a to-be-assembled member and the screw fixing structure provided in the second aspect. The to-be-assembled member is provided with a threaded hole, and the screw threadedly mates with the threaded hole.

BRIEF DESCRIPTION OF DRAWINGS

The drawings described herein, which are incorporated in the specification and form part of the specification, illustrate embodiments of the present disclosure and are intended to explain the principles of the present disclosure together with the description of the drawings.

To illustrate the technical schemes in the embodiments of the present disclosure or in the related art more clearly, the drawings used in the description of the embodiments or the related art are briefly described below. Apparently, those of ordinary skill in the art may obtain other drawings based on the drawings described below on the premise that no creative work is done.

REFERENCE LIST

Figure 1:
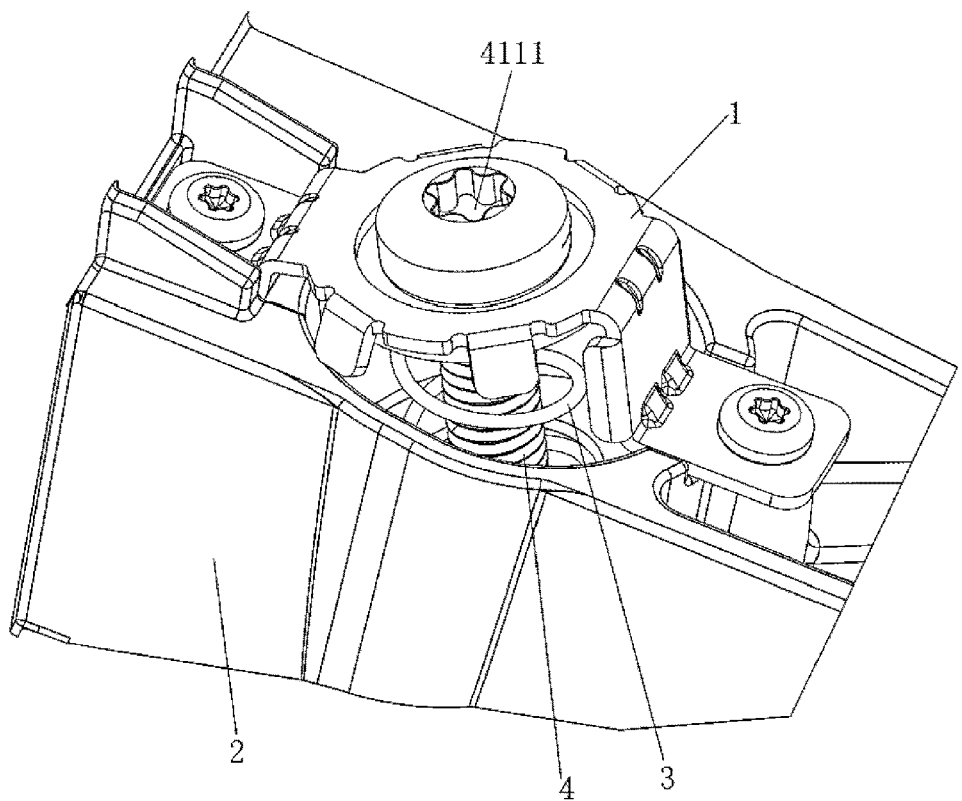
FIG. 1 is a partial structural view of a structure with a screw according to an embodiment of the present disclosure.

1 limiting structure
11 limiting body
111 operating hole
12 limiting member
121 limiting protrusion
1221 guide surface
13 first connecting portion
14 second connecting portion
2 assembly member
21 through hole 211 limiting step
212 abutting step
213 first hole segment
214 second hole segment
215 third hole segment
22 limiting plate
23 limiting notch
3 elastic member
4 screw
41 head portion
411 operating portion
4111 tool hole
412 abutting portion
42 shank portion
5 to-be-assembled member
display device
101 housing
102 display panel

DETAILED DESCRIPTION

For a better understanding of the preceding object, features and advantages of the present disclosure, schemes of the present disclosure are further described below. It is to be noted that if not in collision, embodiments of the present disclosure and features therein may be combined with each other.

Many details are set forth in the following description for a full understanding of the present disclosure, and the present disclosure may be implemented in other manners not described herein. Apparently, the embodiments in the specification are part, not all, of the embodiments of the present disclosure.

Figure 2:
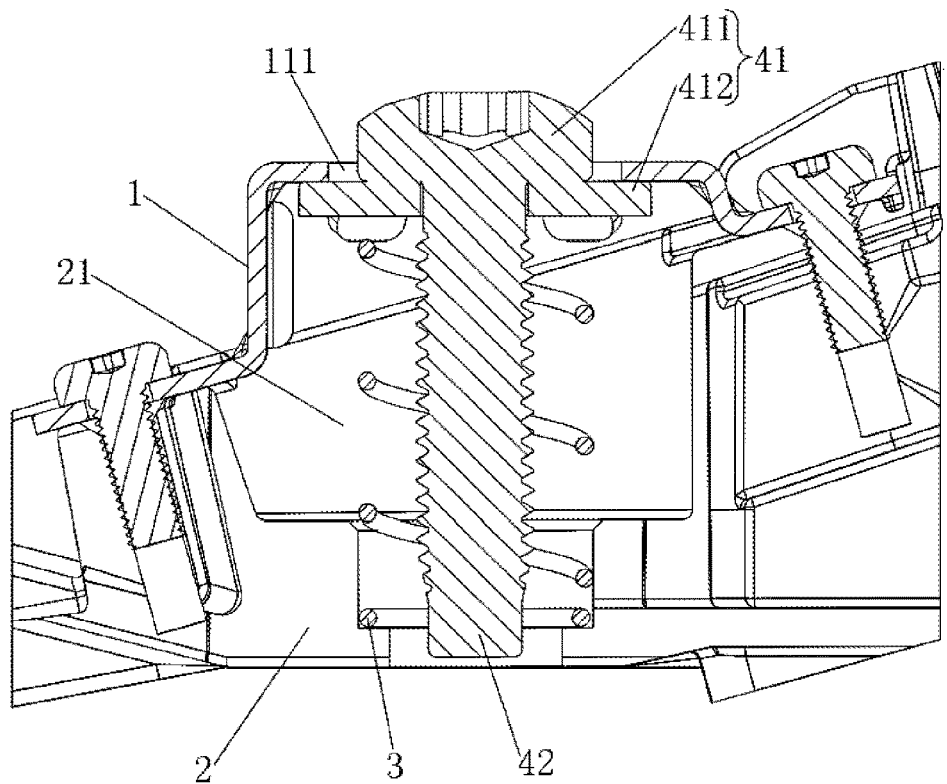
FIG. 2 is a sectional view of a structure with a screw according to an embodiment of the present disclosure.
Figure 3:
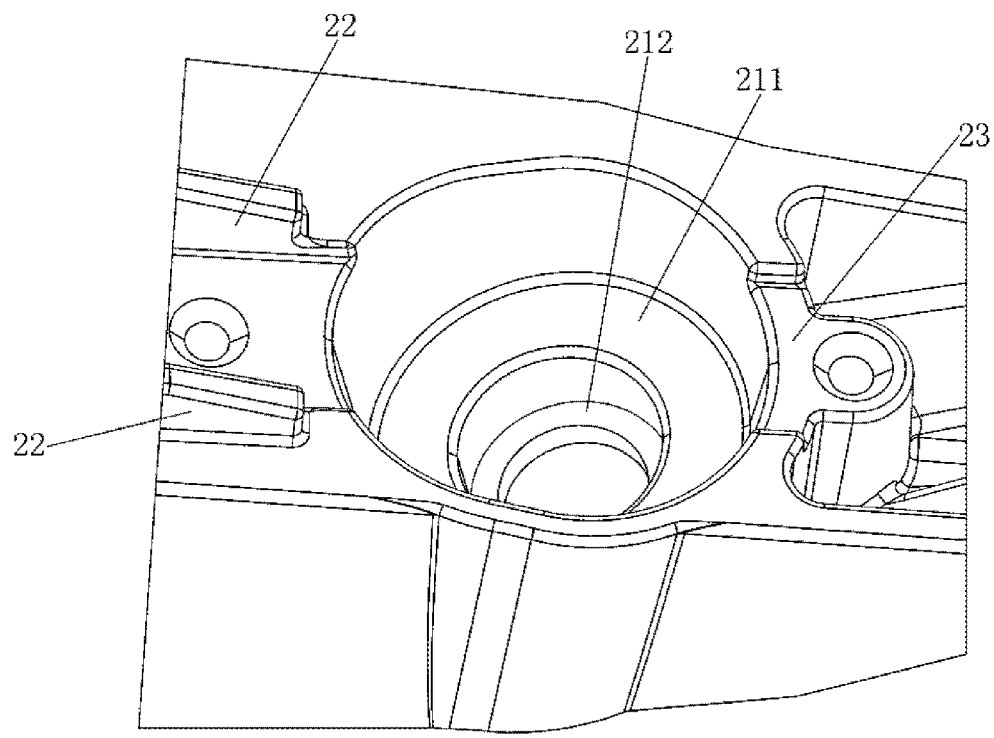
FIG. 3 is a structural view of an assembly member according to an embodiment of the present disclosure.

FIG. 1 is a structural view of a structure with a screw according to an embodiment of the present disclosure. FIG. 2 is a sectional view of a structure with a screw according to an embodiment of the present disclosure. FIG. 3 is a structural view of an assembly member according to an embodiment of the present disclosure.

As shown in FIGS. 1 to 3, the embodiment of the present disclosure provides a structure with a screw, and the structure with a screw includes a limiting structure 1, an assembly member 2, an elastic member 3 and a screw 4. The limiting structure 1 is connected to the assembly member 2 and provided with an operating hole 111. The assembly member 2 is provided with a through hole 21 for accommodating the screw 4 and the elastic member 3, an abutting step 212 is provided in the through hole 21, an end of the elastic member 3 abuts against the abutting step 212, and the other end of the elastic member 3 abuts against the screw 4. A head portion 41 of the screw 4 has an operating portion 411 and an abutting portion 412, the abutting portion 412 abuts against the limiting structure 1, and the operating portion 411 is exposed through the operating hole 111.

The present disclosure provides the structure with a screw, where the assembly member 2, the limiting structure 1 and the elastic member 3 are arranged, one end of the elastic member 3 abuts against the head portion of the screw 4 and the other end of the elastic member 3 abuts against the abutting step 212, the abutting portion 412 of the screw 4 abuts against the limit structure 1, and the operating portion 411 is exposed through the operating hole 111. The limiting structure 1 mates with the elastic member 3 to clamp the screw 4 so that the screw 4 is pre-assembled and prevented from falling off. Due to the presence of the elastic member 3, the elastic member 3 is compressed when the screw 4 is connected to a to-be-assembled member 5, and the elastic member 3 may push the screw 4 back to a position at which the screw 4 abuts against the limiting structure 1 after the screw 4 is disconnected from the to-be-assembled member 5, that is, the screw 4 returns to the pre-assembly position so that the screw 4 can be repeatedly assembled.

In some embodiments, the diameter of the through hole 21 or the diameter of an incircle of the through hole 21 is greater than the nominal diameter of a thread of a shank portion 42 of the screw 4. That is to say, when the through hole 21 is circular, the diameter of the through hole 21 is greater than the nominal diameter of the thread of the shank portion 42 of the screw 4; and when the through hole 21 is polygonal, the diameter of the incircle of the through hole 21 is greater than the nominal diameter of the thread of the shank portion 42 of the screw 4. In this manner, the shank portion 42 of the screw 4 can move in the through hole 21 in the radial direction of the through hole 21 so that the screw 4 can be aligned with a threaded hole of the to-be-assembled member 5 in the presence of a machining error, and the assembly member 2 and the to-be-assembled member can be relatively fixed through the screw 4 with ease.

For example, in an implementation, the operating hole 111 is coaxial with the through hole 21. That is to say, the operating hole 111 and the through hole 21 have the same central axis. In this manner, when the screw 4 abuts against the limiting structure 1 under the action of the elastic member 3, the elastic member 3 applies a force to the screw 4 to maintain the screw 4 on the central axis of the through hole 21 so that the screw 4 is more stable.

As shown in FIG. 2, in some embodiments, the elastic member 3 is sleeved on the shank portion 42 of the screw 4. In this manner, the elastic member 3 can act on the abutting portion 412 and forces applied in the circumferential direction of the screw 4 are more uniform so that the abutting portion 412 more stably abuts against the limiting structure 1.

For example, in an implementation, referring to FIG. 2, the inner diameter of the elastic member 3 is greater than the nominal diameter of the thread of the shank portion 42 of the screw 4. In this manner, the elastic member 3 can provide, to some extent, space for the screw 4 to move radially and can also limit the excessive radial wobbles of the screw 4.

It is to be understood that if the inner diameter of the elastic member 3 is the same as the nominal diameter of the thread of the shank portion 42 of the screw 4, no gap exists between the shank portion 42 of the screw 4 and the elastic member 3; thus, when the screw 4 is assembled with the to-be-assembled member 5, if the position of the screw 4 in the radial direction of the through hole 21 needs to be adjusted, the elastic member 3 also deforms due to the movement of the screw 4 and generates a force due to the deformation, the adjustment of the screw 4 needs to overcome the force of the elastic member 3, and the screw 4 is adjusted with greater difficulty. When the inner diameter of the elastic member 3 is configured to be greater than the nominal diameter of the thread of the shank portion 42 of the screw 4, a gap exists between the shank portion 42 of the screw 4 and the elastic member 3 so that space can be provided for the screw 4 to move. When the position of the screw 4 is adjusted in the radial direction of the through hole 21, the elastic member 3 is prevented from deforming, thereby facilitating the adjustment of the screw 4.

Additionally, the elastic member 3 is disposed in the through hole 21 and sleeved on the shank portion 42 of the screw 4. When the screw 4 generates a relatively large deviation exceeding the gap between the screw 4 and the elastic member 3 during movement in the through hole 21, the elastic member 3 deforms to apply a force to the screw 4 so that the screw 4 is driven to return to a position on the central axis of the through hole 21, thereby limiting the excessive radial wobbles of the screw 4.

It is to be noted that a difference between the inner diameter of the elastic member 3 and the nominal diameter of the thread of the shank portion 42 of the screw 4 may be set according to actual requirements and is not limited here.

For example, in an implementation, the elastic member 3 may be a column spring, which is simple in structure, easy to obtain and low in cost. Alternatively, other structures having elasticity may be selected, such as an elastic pad.

It is to be understood that the column spring having relatively great elasticity and generating a relatively large elastic deformation is used so that screws 4 of different lengths can be pre-assembled by use of elastic deformations of the column spring; alternatively, different column springs may be selected, so as to adjust the force applied to the screw 4.

It is to be noted that the elastic member 3 abuts against the abutting portion 412, and the elastic member 3 is in a compressed state so that one end of the elastic member 3 abuts against the abutting step 212 and the other end of the elastic member 3 abuts against the abutting portion 412, so as to apply an elastic force to the screw 4; therefore, the abutting portion 412 abuts against the limiting structure 1, the screw 4 is stabilized in the through hole 21 and prevented from falling off, and the screw 4 is pre-fixed, thereby achieving the pre-assembly of the screw 4.

As shown in FIG. 3, in some embodiments, a limiting step 211 for limiting the abutting portion 412 in a screwing direction of the screw 4 is provided in the through hole 21, and the limiting step 211 is closer to the limiting structure 1 than the abutting step 212.

The limiting step 211 can limit the abutting portion 412 to limit a lowermost assembly position of the screw 4 and ensure that the screw 4 is screwed in position. That is to say, when the abutting portion 412 is in contact with the limiting step 211, it may be considered that the screw 4 is screwed in position so that the screw 4 is conveniently connected to the to-be-assembled member 5.

For example, in an implementation, at least part of a surface of the limiting step 211 in contact with the abutting portion 412 is an anti-skid surface. In this manner, when the limiting step 211 is in contact with the abutting portion 412, a frictional force between the abutting portion 412 and the limiting step 211 is increased through the anti-skid surface so that the effect of preventing the abutting portion 412 from rotating, that is, the effect of preventing the screw 4 from rotating is achieved to some extent; therefore, after the screw 4 is connected to the to-be-assembled member 5, the following case is avoided: the screw 4 is loosened due to a reverse rotation, reducing the connection effect between the screw 4 and the to-be-assembled member 5.

An anti-skid surface and a smooth surface, which are ring-shaped, are provided on a side of the limiting step 211 facing the abutting portion 412, and the smooth surface is disposed on the inner side of the anti-skid surface. It is to be understood that considering that the screw 4 moves radially, the anti-skid surface is provided only on an outer ring of the limiting step 211, reducing machining difficulty.

For example, in another implementation, at least part of a surface of the abutting portion 412 facing the limiting step 211 may be an anti-skid surface.

An anti-skid surface and a smooth surface, which are ring-shaped, may be provided on a side of the abutting portion 412 facing the limiting step 211, and the smooth surface is disposed on the inner side of the anti-skid surface. It is to be understood that considering that the screw 4 moves radially, the anti-skid surface is provided only on an outer ring of the abutting portion 412, reducing machining difficulty.

For example, in an implementation, at least part of the surface of the abutting portion 412 facing the limiting step 211 may be an anti-skid surface, and at least part of the surface of the limiting step 211 in contact with the abutting portion 412 may be an anti-skid surface, so as to further increase the frictional force between the abutting portion 412 and the limiting step 211.

The anti-skid surface and the smooth surface, which are ring-shaped, are provided on the side of the abutting portion 412 facing the limiting step 211, and the smooth surface is disposed on the inner side of the anti-skid surface on the abutting portion 412; and the anti-skid surface and the smooth surface, which are ring-shaped, are provided on the side of the limiting step 211 facing the abutting portion 412, and the smooth surface is disposed on the inner side of the anti-skid surface on the limiting step 211.

The anti-skid surface is preferably configured to be a serrated structure, that is to say, serrations are provided on the side of the abutting portion 412 facing the limiting step 211 and/or the side of the limiting step 211 facing the abutting portion 412. For example, when the abutting portion 412 is provided with serrations, the serrations on the abutting portion 412 are in close contact with the limiting step 211 when the abutting portion 412 abuts against the limiting step 211, thereby improving the anti-skid property between the screw 4 and the limiting step 211. For example, when both the abutting portion 412 and the limiting step 211 are provided with serrations, the serrations on the abutting portion 412 and the serrations on the limiting step 211 mate to further improve the anti-skid property between the screw 4 and the limiting step 211.

In other implementations, the structure of the anti-skid surface may be selected according to actual requirements, for example, a surface with anti-skid strips or a surface with anti-skid bosses, which are listed one by one herein.

In some other embodiments, the structure with a screw further includes a fastening gasket provided on the limiting step 211. The fastening gasket is disposed to buffer the abutting portion 412 and prevent the abutting portion 412 from being in direct contact with the limiting step 211 and damaging the limiting step 211.

For example, at least part of a surface of the limiting step 211 in contact with the fastening gasket is an anti-skid surface; and/or at least part of a surface of the fastening gasket in contact with the limiting step 211 is an anti-skid surface; and/or at least part of a surface of the fastening gasket facing the abutting portion 412 is an anti-skid surface; and/or at least part of a surface of the abutting portion 412 facing the fastening gasket is an anti-skid surface.

That is to say, at least part of at least one surface among the surface of the limiting step 211 in contact with the fastening gasket, the surface of the abutting portion 412 facing the fastening gasket, the surface of the fastening gasket facing the abutting portion 412 and the surface of the fastening gasket in contact with the limiting step 211 is the anti-skid surface, so as to enhance the frictional force on the abutting portion 412 and avoid the case where the screw 4 is easily loosened.

Similarly, the anti-skid surface is preferably configured to be a serrated structure or may be a surface with anti-skid strips, a surface with anti-skid bosses or the like.

Figure 4:
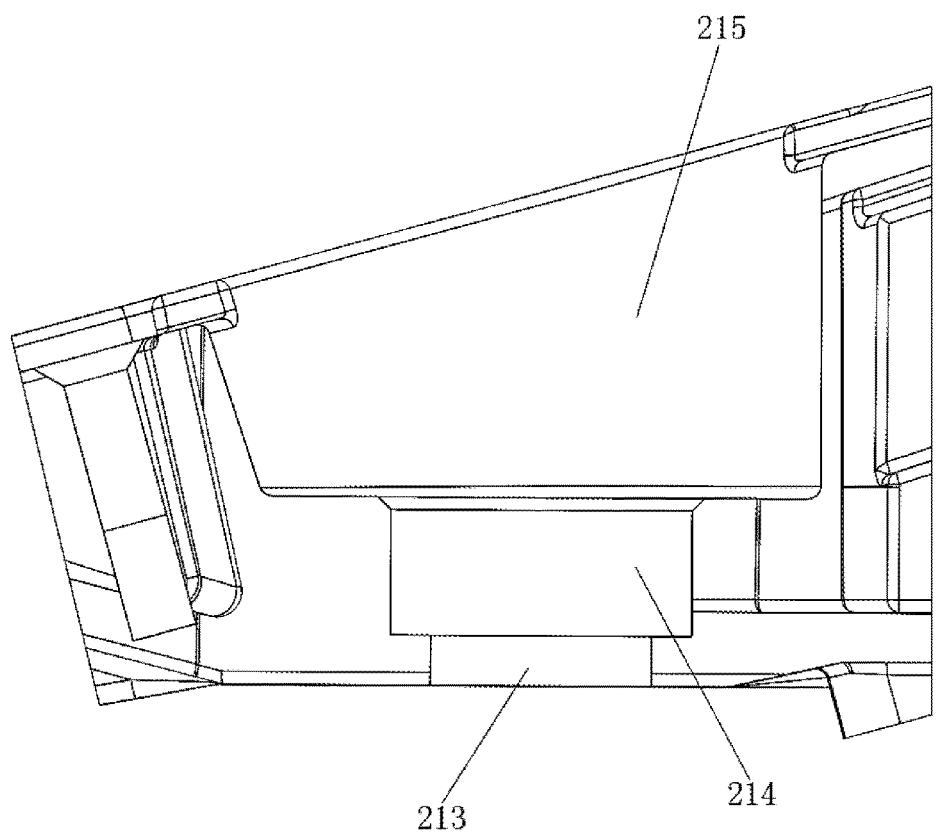
FIG. 4 is a sectional view of an assembly member according to an embodiment of the present disclosure.

FIG. 4 is a sectional view of an assembly member according to an embodiment of the present disclosure.

As shown in FIG. 4, in some embodiments, the through hole 21 includes a first hole segment 213 and a second hole segment 214, the diameter of the first hole segment 213 is smaller than the diameter of the second hole segment 214, and a stepped surface between the first hole segment 213 and the second hole segment 214 forms the abutting step 212.

It is to be understood that the second hole segment 214 is closer to the limiting structure 1 than the first hole segment 213 so that the abutting step 212 formed by the first hole segment 213 and the second hole segment 214 can limit the elastic member 3 in the through hole 21.

Further, referring to FIG. 4, the through hole 21 further includes a third hole segment 215, the diameter of the third hole segment 215 is greater than the diameter of the second hole segment 214, and a stepped surface between the third hole segment 215 and the second hole segment 214 forms the limiting step 211.

That is to say, along the screwing direction of the screw 4, the through hole 21 is variable in diameter, and the diameter of the third hole segment 215 is the largest. In this manner, it is to be understood that the diameter of the third hole segment 215 is greater than the nominal diameter of the thread of the shank portion 42 of the screw 4 so that the shank portion 42 of the screw 4 can move in the radial direction of the through hole 21. Therefore, the screw 4 can be aligned with the threaded hole of the to-be-assembled member 5 in the presence of a machining error, and the assembly member 2 and the to-be-assembled member 5 can be relatively fixed through the screw 4 with ease.

Figure 5:
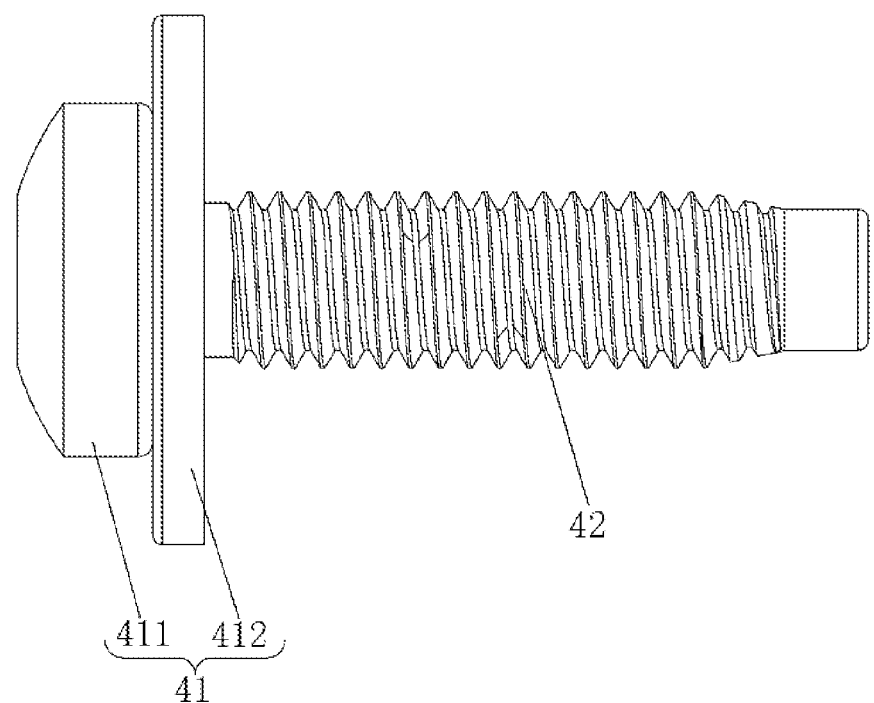
FIG. 5 is a structural view of a screw according to an embodiment of the present disclosure.
Figure 6:
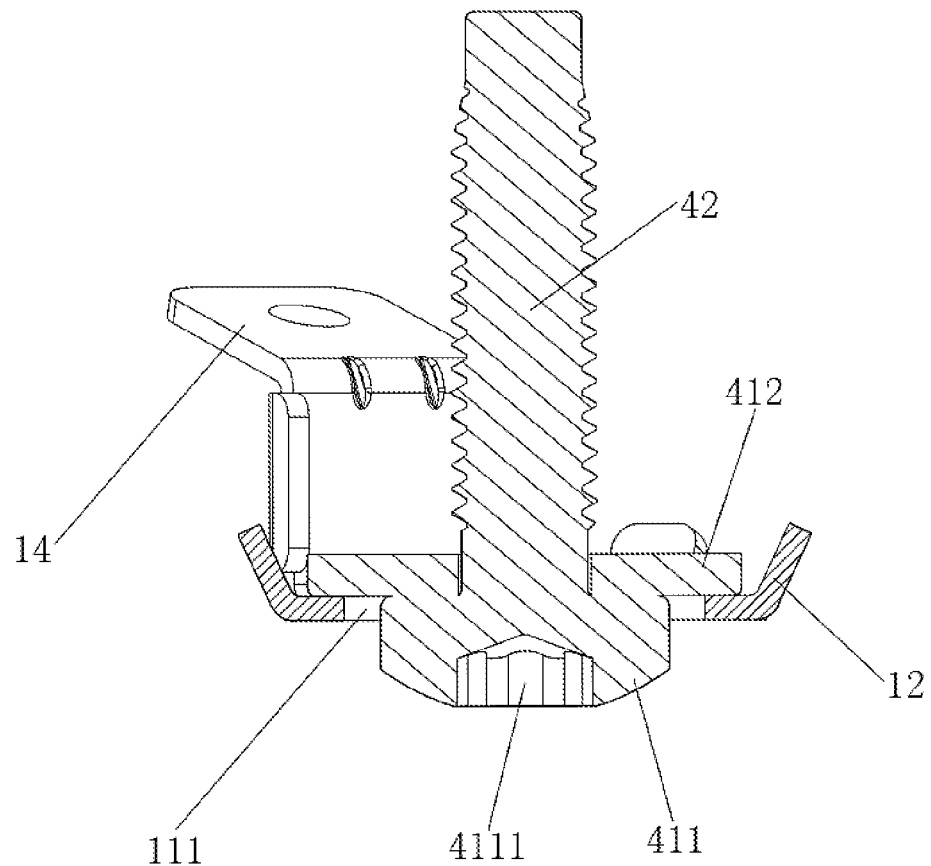
FIG. 6 is a sectional view of a screw mating with a limiting structure according to an embodiment of the present disclosure.

FIG. 5 is a structural view of a screw according to an embodiment of the present disclosure. FIG. 6 is a sectional view of a screw mating with a limiting structure according to an embodiment of the present disclosure.

As shown in FIGS. 2 and 6, in some embodiments, the operating portion 411 penetrates through the operating hole 111, and a difference between an equivalent diameter of the operating hole 111 and an equivalent outer diameter of the operating portion 411 ranges from 0.5 mm to 4 mm.

That is to say, the distance between a peripheral surface of the operating portion 411 and a hole wall surface of the operating hole 111 is 0.5 mm to 4 mm so that the operating portion 411 conveniently extends into the operating hole 111, space is provided for the screw 4 to move radially, and the operating hole 111 limits the operating portion 411 in the radial direction to some extent, so as to prevent the operating portion 411 from generating relatively large wobbles in the operating hole 111.

For example, in an implementation, referring to FIG. 6, the operating hole 111 is a circular hole, the operating portion 411 is a circular structure, and the difference between the diameter of the operating hole 111 and the outer diameter of the operating portion 411 ranges from 0.5 mm to 4 mm.

For example, in an implementation, the contour of the operating portion 411 and the operating hole 111 are the same in shape, which are both polygonal or elliptical. In this manner, the operating hole 111 can limit the rotation of the operating portion 411, that is, prevent the operating portion 411 from rotating in the operating hole 111, thereby improving the stability of the operating portion 411 in the operating hole 111 and the stability of the screw 4.

As shown in FIGS. 1 to 6, in some embodiments, the operating portion 411 is provided with a tool hole 4111 so that the screw 4 is conveniently screwed with a tool.

For example, in an implementation, referring to FIGS. 1 and 5, the tool hole 4111 may be a plum counterbore. Alternatively, the tool hole 4111 may be a hex counterbore.

As shown in FIGS. 5 and 6, in some embodiments, the operating portion 411 and the abutting portion 412 are integrally formed. In this manner, an assembly process can be omitted and assembly efficiency can be improved. Alternatively, the operating portion 411 and the abutting portion 412 are provided separately and are connected to form the head portion 41 of the screw 4. For example, the abutting portion 412 is a limiting gasket sleeved on the shank portion 42 of the screw 4, and the limiting gasket is connected to the screw 4 through welding to form a new head portion 41 of the screw 4 with the original head portion of the screw 4.

As shown in FIGS. 5 and 6, in some embodiments, the abutting portion 412 and the operating portion 411 constitute a step structure, and in at least one direction perpendicular to an axial direction of the shank portion 42 of the screw 4, the length of the abutting portion 412 is greater than the diameter of the operating hole 111 or the diameter of an incircle of the operating hole 111. In this manner, the screw 4 is limited through a dimension relationship between the abutting portion 412 and the operating hole 111 so that the abutting portion 412 and the limiting structure 1 are in surface contact, thereby improving the stability of the screw 4.

For example, in an implementation, referring to FIG. 6, the abutting portion 412 may be a circular structure, the operating hole 111 may be the circular hole, and the outer diameter of the abutting portion 412 is greater than the diameter of the operating hole 111. In another implementation, the abutting portion 412 may be a polygonal structure, the operating hole 111 is the circular hole, and in at least one direction perpendicular to the axial direction of the shank portion 42 of the screw 4, the length of the abutting portion 412 is greater than the diameter of the operating hole 111; or the abutting portion 412 may be a polygonal structure, the operating hole 111 is a polygonal hole, and in at least one direction perpendicular to the axial direction of the shank portion 42 of the screw 4, the length of the abutting portion 412 is greater than the diameter of the incircle of the operating hole 111. Alternatively, the abutting portion 412 may be a circular structure, the operating hole 111 is a polygonal hole, and the diameter of the abutting portion 412 is greater than the diameter of the incircle of the operating hole 111.

In some other embodiments, the abutting portion 412 and the operating portion 411 may constitute a step structure, the operating portion 411 and the abutting portion 412 are arranged in sequence along the screwing direction of the screw 4, the diameter of the abutting portion 412 gradually increases along the screwing direction of the screw 4, and the maximum diameter of the abutting portion 412 is greater than the diameter of the incircle of the operating hole 111 so that the abutting portion 412 and the limiting structure 1 are in line contact to limit the screw 4.

Figure 7:
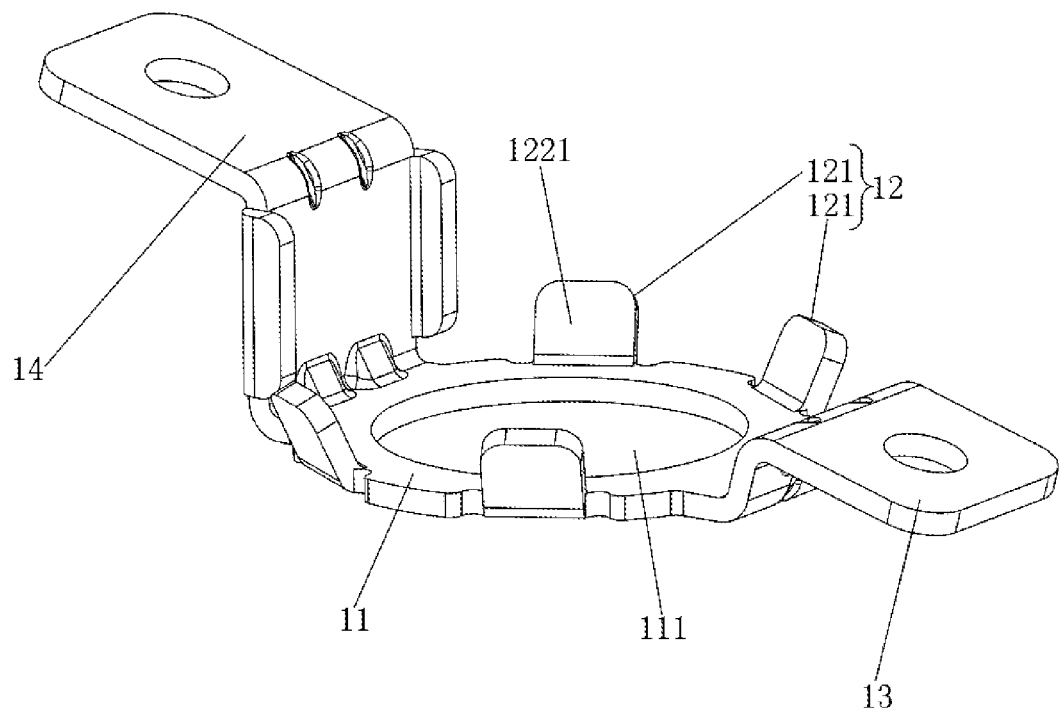
FIG. 7 is a structural view of a limiting structure according to an embodiment of the present disclosure.

FIG. 7 is a structural view of a limiting structure according to an embodiment of the present disclosure.

As shown in FIGS. 6 and 7, in some embodiments, a limiting member 12 is provided on a side of the limiting structure 1 facing the elastic member 3 and around the operating hole 111, and the limiting member 12 is configured to limit the head portion 41 of the screw 4 in a radial direction of the operating hole 111.

The limiting member 12 is used for limiting the abutting portion 412 in the radial direction of the operating hole 111. In this manner, when the abutting portion 412 abuts against the limiting structure 1, the limiting member 12 limits the head portion 41 of the screw 4 in the radial direction of the operating hole 111 so that the screw 4 can abut against the limiting structure 1 stably under the action of the elastic member 3, thereby improving the stability of the screw 4.

For example, in an implementation, referring to FIG. 7, the limiting structure 1 has a limiting body 11 provided with the operating hole 111, the limiting member 12 is disposed on the periphery of the limiting body 11, and the abutting portion 412 abuts against the limiting body 11 and has a gap with the limiting member 12.

That is to say, when the abutting portion 412 abuts against the limiting body 11, the limiting member 12 positions and limits the abutting portion 412 in the radial direction of the operating hole 111, but the abutting portion 412 has a certain movement space in the radial direction of the operating hole 111 so that the screw 4 is conveniently pushed along the screwing direction of the screw 4.

For example, in an implementation, referring to FIG. 7, a guide surface 1221 inclined relative to the axial direction of the operating hole 111 is provided on the inner side of the limiting member 12, and along the screwing direction of the screw 4, the distance between the guide surface 1221 and the central axis of the operating hole 111 gradually increases.

That is to say, when the screw 4 moves towards the limiting structure 1 under the action of the elastic member 3, the guide surface 1221 may guide the head portion 41 of the screw 4. Even if the screw 4 deviates, the screw 4 can be guided to move along the guide surface 1221 into a space surrounded by the limiting member 12, that is, the head portion 41 of the screw 4 can be moved to the center, avoiding too large a deviation of the screw 4 in the radial direction, ensuring as much as possible that the screw 4 and the through hole 21 are coaxial, and facilitating the subsequent screwing of the screw 4.

For example, in an implementation, the limiting member 12 may include multiple limiting protrusions 121 spaced apart along the peripheral direction of the operating hole 111. That is to say, the limiting member 12 is not a ring-shaped whole but the multiple limiting protrusions 121 spaced apart, and the limiting protrusions 121 each have the preceding guide surface 1221 so that the weight of the limiting structure 1 can be reduced. Alternatively, the limiting member 12 may be ring-shaped, that is to say, the limiting member 12 is a ring-shaped whole.

Figure 8:
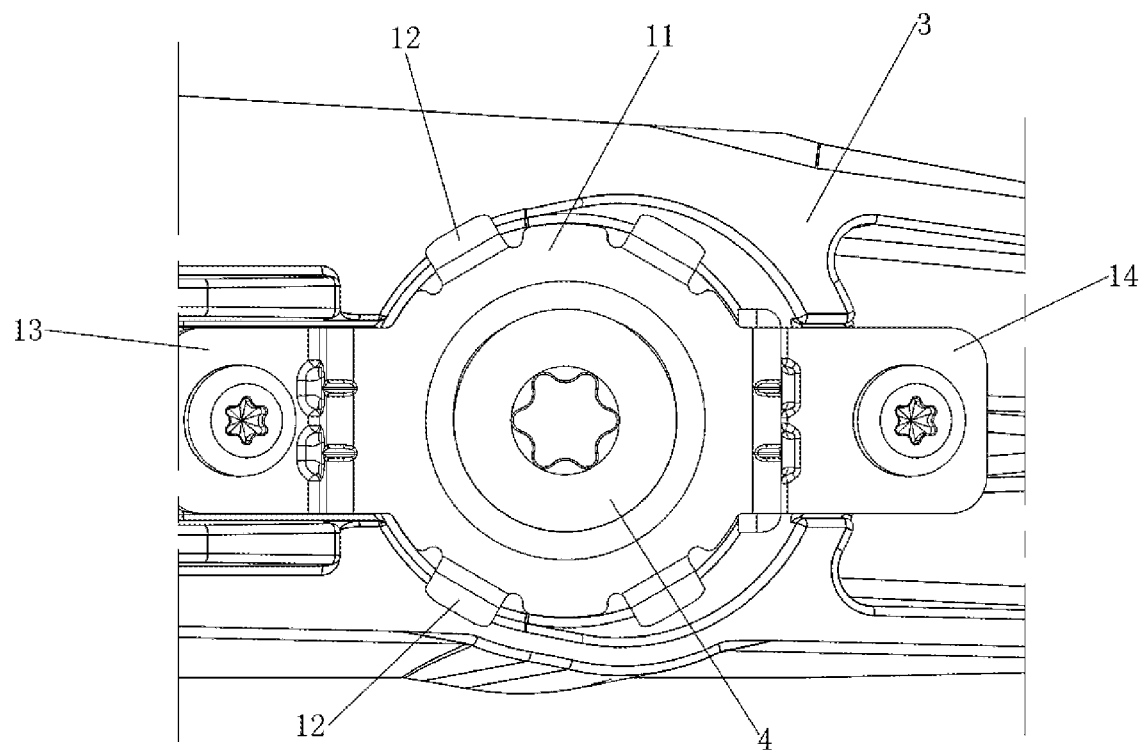
FIG. 8 is a top view of a structure with a screw according to an embodiment of the present disclosure.

FIG. 8 is a top view of a structure with a screw according to an embodiment of the present disclosure.

As shown in FIGS. 3, 7 and 8, in some embodiments, the limiting structure 1 has a first connecting portion 13 connected to the assembly member 2. Two limiting plates 22 spaced apart protrude on the assembly member 2, and a limiting groove for limiting the first connecting portion 13 is formed between the two limiting plates 22.

That is to say, the limiting structure 1 is connected to the assembly member 2 through the first connecting portion 13, and the assembly member 2 is provided with the limiting groove for limiting the first connecting portion 13 so that the first connecting portion 13 can be positioned and limited, thereby ensuring that the first connecting portion 13 is smoothly connected to the assembly member 2.

For example, in an implementation, the assembly member 2 further has a limiting surface for limiting the first connecting portion 13, the limiting surface intersects inner side surfaces of the limiting plates 22 facing the limiting groove. When the first connecting portion 13 is in contact with the limiting surface, it may be considered that the first connecting portion 13 is placed in position. The limiting surface can further improve the positioning effect of the first connecting portion 13.

As shown in FIGS. 3, 7 and 8, in some embodiments, the limiting structure 1 has a second connecting portion 14 connected to the assembly member 2. The assembly member 2 is provided with a limiting notch 23 communicating with the through hole 21, and two sidewalls of the limiting notch 23 in the peripheral direction of the through hole 21 are used for limiting the second connecting portion 14.

That is to say, the limiting structure 1 is also connected to the assembly member 2 through the second connecting portion 14, and the assembly member 2 is provided with the limiting notch 23 for limiting the second connecting portion 14.

It is to be understood that the limiting structure 1 has multiple degrees of freedom relative to the assembly member 2 and is difficult to accurately mount or is mounted with relatively great difficulty, and since the limiting structure 1 is to limit the screw 4, the alignment accuracy of the screw 4 is affected if the limiting structure 1 deviates. Therefore, the degree of freedom of the limiting structure 1 can be reduced and the limiting structure 1 can be positioned through the limiting groove and the limiting notch 23 so that mounting accuracy can be improved, mounting difficulty can be reduced, the accuracy of the subsequent positioning of the screw 4 can be improved, and a deviation of the screw 4 due to a deviation of the limiting structure 1 can be avoided.

It is to be noted that the limiting body 11, the limiting member 12, the first connecting portion 13 and the second connecting portion 14 constituting the limiting structure 1 are integrally formed, that is, the limiting body 11, the limiting member 12, the first connecting portion 13 and the second connecting portion 14 are integrally machined and formed. For example, the limiting structure 1 is a sheet metal part or an injection molded part so that the number of parts can be reduced and assembly difficulty can be reduced.

In some embodiments, the limiting structure 1 is detachably connected to the assembly member 2.

For example, in an implementation, the limiting structure 1 is detachably connected to the assembly member 2 through screws. The limiting structure 1 is detachably connected to the assembly member 2 through screws so that the limiting structure 1 is mounted and detached conveniently.

Referring to FIGS. 3, 7 and 8, the first connecting portion 13 and the second connecting portion 14 of the limiting structure 1 are each provided with a through hole, the assembly member 2 is correspondingly provided with two threaded holes, and the threaded holes mate with the screws to achieve the connection between the limiting structure 1 and the assembly member 2. It is to be understood that when the first connecting portion 13 is located in the limiting groove and in contact with the limiting surface, and the second connecting portion 14 is located in the limiting notch 23, the through hole of the first connecting portion 13 is aligned with one of the threaded holes, and the through hole of the second connecting portion 14 is aligned with the other of the threaded holes so that the screws are conveniently mounted.

For example, in another implementation, the limiting structure 1 may be detachably connected to the assembly member 2 through a snap fit.

In some other embodiments, the limiting structure 1 and the assembly member 2 may be fixedly connected in other manners such as welding and bonding.

Figure 9:
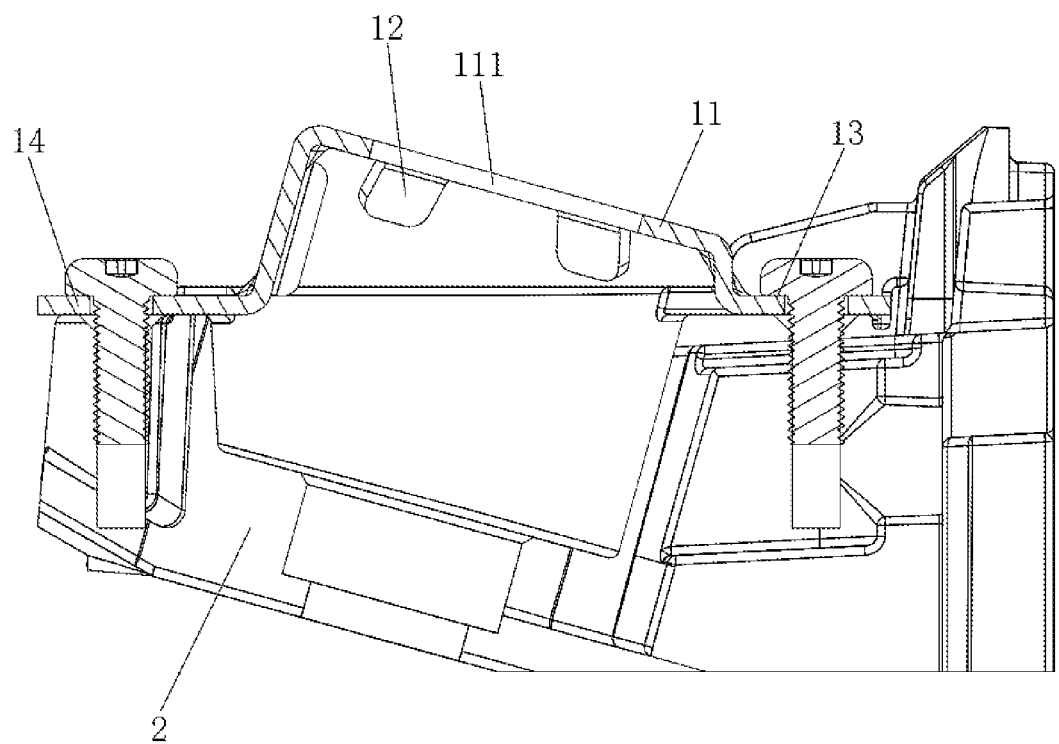
FIG. 9 is schematic view one of a limiting structure mating with an assembly member according to an embodiment of the present disclosure.
Figure 10:
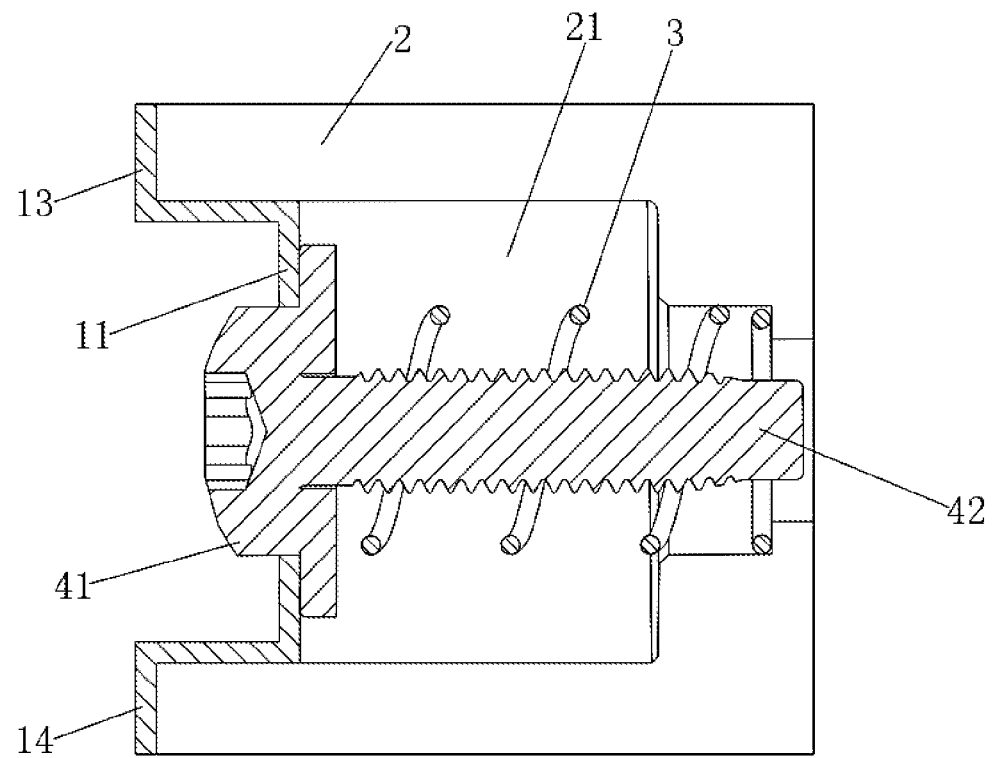
FIG. 10 is schematic view two of a limiting structure mating with an assembly member according to an embodiment of the present disclosure.

FIG. 9 is a schematic view one of a limiting structure mating with an assembly member according to an embodiment of the present disclosure. FIG. 10 is a schematic view two of a limiting structure mating with an assembly member according to an embodiment of the present disclosure.

In some embodiments, the limiting structure 1 has the limiting body 11 abutting against the abutting portion 412, the limiting body 11 is provided with the operating hole 111, and the limiting body 11 protrudes from the assembly member 2 or is disposed in the through hole 21.

For example, in an implementation, referring to FIG. 9, the limiting body 11 protrudes from the assembly member 2. That is to say, the limiting body 11 is disposed outside the through hole 21. In this case, the limiting body 11 does not occupy the space of the through hole 21 so that a relatively long screw may be selected, so as to increase the length of the connection between the screw 4 and the to-be-assembled member 5 or adapt to a relatively large gap between the to-be-assembled member 5 and the assembly member 2.

For example, in an implementation, referring to FIG. 10, the limiting body 11 is disposed in the through hole 21. That is to say, the limiting body 11 may be hidden in the through hole 21. In this case, the limiting body 11 can be prevented from protruding and affecting the mating between the assembly member 2 and another structure, and the limiting body 11 and the screw 4 can be protected, thereby avoiding a collision with the limiting body 11. Additionally, the limiting body 11 is disposed in the through hole 21 so that the structure with a screw can adapt to a relatively short screw 4.

In some embodiments, when the abutting portion 412 abuts against the limiting structure 1, an end of the shank portion 42 of the screw 4 facing away from the head portion 41 has a gap with the to-be-assembled member 5 mating with the assembly member 2. That is, after the screw 4 is disconnected from the to-be-assembled member 5, the screw 4 is completely separated from the to-be-assembled member 5 under the action of the elastic member 3.

In an implementation, as shown in FIG. 2, in some embodiments, when the abutting portion 412 abuts against the limiting structure 1, the end of the shank portion 42 of the screw 4 facing away from the head portion 41 is located in the through hole 21.

That is to say, when the screw 4 is not connected to the to-be-assembled member 5, the screw 4 is completely located in the through hole 21, and the screw 4 does not affect the assembly and positioning of the assembly member 2 and the to-be-assembled member 5. After the screw 4 is disconnected from the to-be-assembled member 5, all of the screw 4 returns into the through hole 21 under the action of the elastic member 3, thereby preventing the screw 4 from extending out and affecting the separation of the to-be-assembled member 5 from the assembly member 2.

Figure 11:
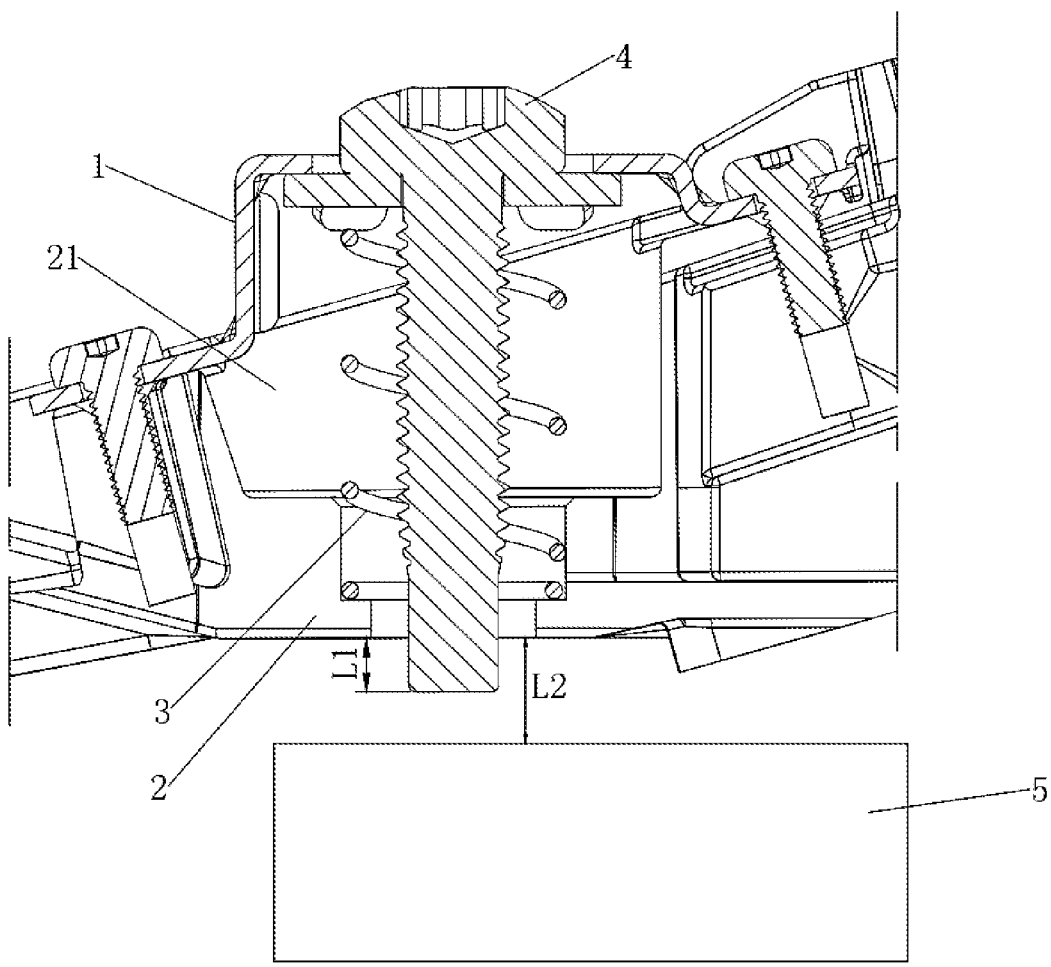
FIG. 11 is a sectional view of a screw fixing structure according to an embodiment of the present disclosure.

FIG. 11 is a sectional view two of a structure with a screw according to an embodiment of the present disclosure.

In another implementation, as shown in FIG. 11, in some embodiments, when the abutting portion 412 abuts against the limiting structure 1, the shank portion 42 of the screw 4 extends out of the through hole 21 by a preset distance L1, and the preset distance L1 is smaller than a gap L2 between the assembly member 2 and the to-be-assembled member 5 mating with the assembly member 2 at the through hole 21.

In this manner, when the screw 4 is not connected to the to-be-assembled member 5, the screw 4 does not affect the assembly and positioning of the assembly member 2 and the to-be-assembled member 5; after the screw 4 is disconnected from the to-be-assembled member 5, the screw 4 moves under the action of the elastic member 3 to a position where the screw 4 has a gap with the to-be-assembled member 5 and does not affect the separation of the assembly member 2 from the to-be-assembled member 5.

An assembly method of the structure with a screw is described in detail below.

The elastic member 3 and the screw 4 are placed in the through hole 21 such that one end of the elastic member 3 abuts against the abutting step 212 and the other end of the elastic member 3 abuts against the screw 4.

The limiting structure 1 is connected to the assembly member 2 such that the operating portion 411 is exposed through the operating hole 111 and the abutting portion 412 abuts against the limiting structure 1.

It is to be noted that when the limiting structure 1 is connected to the assembly member 2, the screw 4 needs to be pressed through tooling, that is, the screw 4 is prevented from interfering with the mounting of the limiting structure 1. After the limiting structure 1 is connected to the assembly member 2, the tooling is removed so that the operating portion 411 of the screw 4 is exposed through the operating hole 111, and the abutting portion 412 of the screw 4 abuts against the limiting structure 1.

Figure 12:
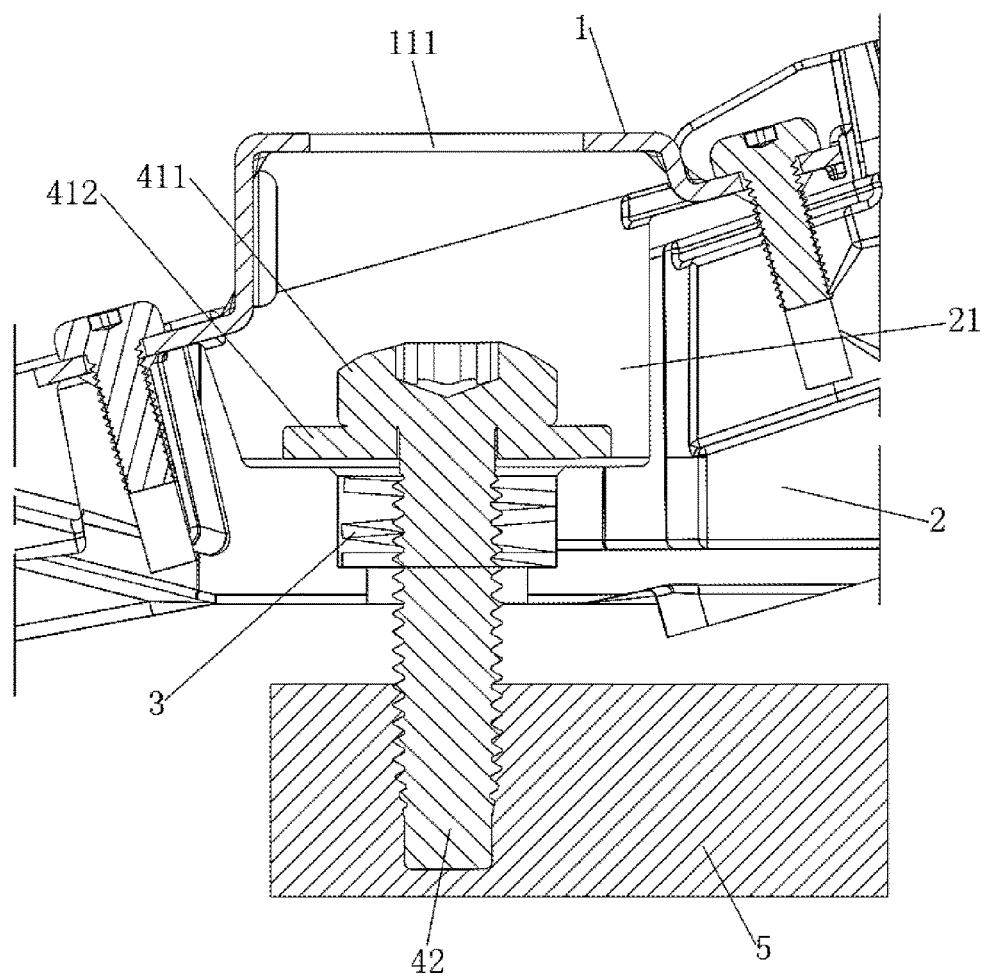
FIG. 12 is a structural view of a screw fixing structure according to an embodiment of the present disclosure.

FIG. 12 is a structural view of a screw fixing structure according to an embodiment of the present disclosure.

As shown in FIG. 12, the screw fixing structure includes a limiting structure 1, an assembly member 2, an elastic member 3 and a screw 4, the limiting structure 1 is connected to the assembly member 2 and provided with an operating hole 111, the assembly member 2 is provided with a through hole 21 for accommodating the screw 4 and the elastic member 3, an abutting step 212 is provided in the through hole 21, one end of the elastic member 3 abuts against the abutting step 212 and the other end of the elastic member 3 abuts against the screw 4, a shank portion 42 of the screw 4 is connected to a to-be-assembled member 5, and a head portion 41 of the screw 4 has an operating portion 411 and an abutting portion 412. When the shank portion 42 of the screw 4 is disconnected from the to-be-assembled member 5, the elastic member 3 pushes the screw 4 towards the limiting structure 1 so that the abutting portion 412 abuts against the limiting structure 1, and the operating portion 411 is exposed through the operating hole 111.

With the screw fixing structure, after the screw 4 is disconnected from the to-be-assembled member 5, the screw 4 moves towards the limiting structure 1 under the action of the elastic member 3, and finally the abutting portion 412 abuts against the limiting structure 1 and the operating portion 411 is exposed through the operating hole 111, thereby facilitating the next connection between the screw 4 and the to-be-assembled member 5. It is to be understood that the screw 4 can return to an original position after disconnected from the to-be-assembled member 5 so that in the case where the screw 4 is not easy to take out within a limited space, the screw 4 can be prevented from falling off, and assembly can be repeatedly performed through the screw 4.

In some embodiments, the abutting portion 412 and the operating portion 411 constitute a step structure, and in at least one direction perpendicular to an axial direction of the shank portion 42 of the screw 4, the length of the abutting portion 412 is greater than the diameter of the operating hole 111 or the diameter of an incircle of the operating hole 111. In this manner, the screw 4 is limited through a dimension relationship between the abutting portion 412 and the operating hole 111 so that the abutting portion 412 and the limiting structure 1 are in surface contact, thereby improving the stability of the screw 4.

For example, in an implementation, referring to FIG. 12, the abutting portion 412 may be a circular structure, the operating hole 111 may be a circular hole, and the outer diameter of the abutting portion 412 is greater than the diameter of the operating hole 111. In another specific implementation, the abutting portion 412 may be a polygonal structure, the operating hole 111 is a circular hole, and in at least one direction perpendicular to the axial direction of the shank portion 42 of the screw 4, the length of the abutting portion 412 is greater than the diameter of the operating hole 111; or the abutting portion 412 may be a polygonal structure, the operating hole 111 is a polygonal hole, and in at least one direction perpendicular to the axial direction of the shank portion 42 of the screw 4, the length of the abutting portion 412 is greater than the diameter of the incircle of the operating hole 111. Alternatively, the abutting portion 412 may be a circular structure, the operating hole 111 is a polygonal hole, and the diameter of the abutting portion 412 is greater than the diameter of the incircle of the operating hole 111.

Figure 13:
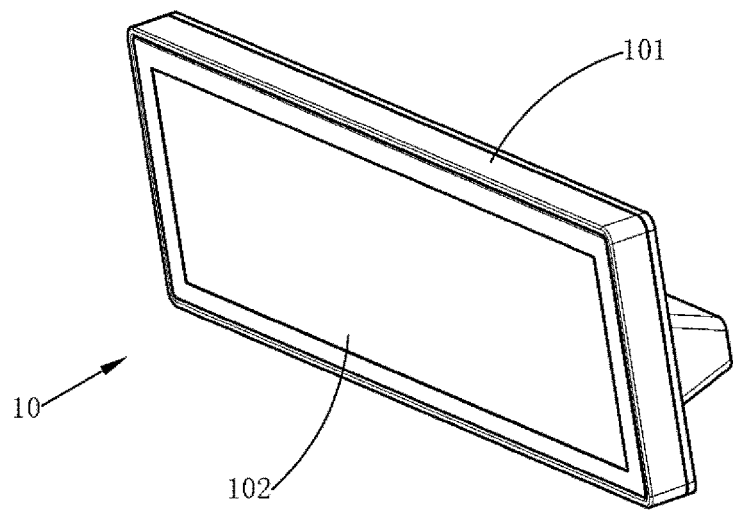
FIG. 13 is a structural view of a display device according to an embodiment of the present disclosure.

FIG. 13 is a structural view of a display device according to an embodiment of the present disclosure.

The present disclosure further provides a display device. Referring to FIG. 13, the display device includes a display panel 102, a to-be-assembled member 5 and a screw fixing structure, the to-be-assembled member 5 is provided with a threaded hole, and a screw 4 threadedly mates with the threaded hole.

When the to-be-assembled member 5 and an assembly member 2 are assembled, the threaded hole of the to-be-assembled member 5 is aligned with a first hole segment 213 of a through hole 21 of the assembly member 2, then an operating portion 411 is pressed and the screw 4 is screwed into the threaded hole with a tool, and the screw 4 stops being screwed after an abutting portion 412 of the screw 4 is in contact with a limiting step 211, where the screw 4 compresses an elastic member 3 during the screwing of the screw 4. When the to-be-assembled member 5 needs to be detached from the assembly member 2, the screw 4 is screwed in an opposite direction so that the screw 4 is moved out of the threaded hole, and then the screw 4 is pushed towards a limiting structure 1 under the action of the elastic member 3 until the abutting portion 412 of the screw 4 abuts against the limiting structure 1 and the operating portion 411 is exposed through an operating hole 111.

The display device has the technical effects of the screw fixing structure in the preceding embodiment, and the details are not repeated here.

For example, the display device in this embodiment may be an in-vehicle display. That is, the assembly member 2 may be, for example, a rear housing of the in-vehicle display, the to-be-assembled member 5 may be, for example, a front cover of the in-vehicle display, the front cover and the rear housing constitute a housing 101 of the display device, and the display panel 102 is mounted on the housing 101. Alternatively, the display device may be a display on another product such as a home appliance.

It is to be noted that relational terms such as "first" and "second" used herein are used for distinguishing one entity or operation from another and are not necessarily used to require or imply any such actual relationship or order between these entities or operations. Moreover, terms "comprising" and "including" or any other variants thereof are intended to encompass a non-exclusive inclusion so that a process, method, article or device that includes a series of elements not only includes these elements but also includes other elements that are not expressly listed or are inherent to such process, method, article or device. In the absence of more restrictions, the elements defined by the statement "including a . . . " do not exclude the presence of additional identical elements in the process, method, article or device that includes the elements.

The preceding are embodiments of the present disclosure to enable those skilled in the art to understand or implement the present disclosure. Various modifications made to these embodiments are apparent to those skilled in the art, and the general principles defined herein may be implemented in other embodiments without departing from the spirit or scope of the present disclosure. Therefore, the present disclosure is not limited to the embodiments described herein but is to accord with the widest scope consistent with the principles and novel features disclosed herein.

What is claimed is:

1. A structure with a screw, comprising a limiting structure, an assembly member, an elastic member and the screw, wherein the limiting structure is connected to the assembly member and provided with an operating hole, the assembly member is provided with a through hole for accommodating the screw and the elastic member, an abutting step is provided in the through hole, an end of the elastic member abuts against the abutting step and another end of the elastic member abuts against the screw, a head portion of the screw has an operating portion and an abutting portion, the abutting portion abuts against the limiting structure, and the operating portion is exposed through the operating hole.

2. The structure with a screw of claim 1, wherein the operating portion and the abutting portion are integrally formed.

3. The structure with a screw of claim 1, wherein the operating portion penetrates through the operating hole.

4. The structure with a screw of claim 3, wherein a contour of the operating portion and the operating hole have a same shape.

5. The structure with a screw of claim 1, wherein the abutting portion and the operating portion constitute a step structure, and in at least one direction perpendicular to an axial direction of a shank portion of the screw, a length of the abutting portion is greater than a diameter of the operating hole or a diameter of an incircle of the operating hole.

6. The structure with a screw of claim 1, wherein the elastic member is sleeved on a shank portion of the screw.

7. The structure with a screw of claim 1, wherein the limiting structure has a limiting body abutting against the abutting portion, the limiting body is provided with the operating hole, and the limiting body protrudes from the assembly member or is disposed in the through hole.

8. The structure with a screw of claim 1, wherein a limiting member is provided on a side of the limiting structure facing the elastic member and around the operating hole, and the limiting member is configured to limit the head portion of the screw in a radial direction of the operating hole.

9. The structure with a screw of claim 8, wherein the limiting structure has a limiting body provided with the operating hole, the limiting member is disposed on a periphery of the limiting body, and the abutting portion abuts against the limiting body and has a gap with the limiting member.

10. The structure with a screw of claim 8, wherein a guide surface inclined relative to an axial direction of the operating hole is provided on an inner side of the limiting member, and along a screwing direction of the screw, a distance between the guide surface and a central axis of the operating hole gradually increases.

11. The structure with a screw of claim 8, wherein the limiting member comprises a plurality of limiting protrusions spaced apart along a peripheral direction of the operating hole.

12. The structure with a screw of claim 1, wherein the limiting structure has a first connecting portion connected to the assembly member; and
    two limiting plates spaced apart protrude on the assembly member, wherein a limiting groove for limiting the first connecting portion is formed between the two limiting plates.

13. The structure with a screw of claim 1, wherein the limiting structure has a second connecting portion connected to the assembly member; and
    the assembly member is provided with a limiting notch communicating with the through hole, and two sidewalls of the limiting notch in a peripheral direction of the through hole are used for limiting the second connecting portion.

14. The structure with a screw of claim 1, wherein a limiting step for limiting the abutting portion in a screwing direction of the screw is provided in the through hole, and the limiting step is closer to the limiting structure than the abutting step.

15. The structure with a screw of claim 14, wherein at least part of a surface of the limiting step facing the abutting portion is an anti-skid surface; and/or
    at least part of a surface of the abutting portion facing the limiting step is an anti-skid surface.

16. The structure with a screw of claim 14, wherein a ring-shaped anti-skid surface and a ring-shaped smooth surface are provided on a side of the limiting step facing the abutting portion, wherein the smooth surface is disposed on an inner side of the anti-skid surface; and/or
    a ring-shaped anti-skid surface and a ring-shaped smooth surface are provided on a side of the abutting portion facing the limiting step, wherein the smooth surface is disposed on an inner side of the anti-skid surface.

17. The structure with a screw of claim 14, further comprising: a fastening gasket provided on the limiting step;
    wherein at least part of a surface of the limiting step in contact with the fastening gasket is an anti-skid surface; and/or
    at least part of a surface of the fastening gasket in contact with the limiting step is an anti-skid surface; and/or
    at least part of a surface of the fastening gasket facing the abutting portion is an anti-skid surface; and/or
    at least part of a surface of the abutting portion facing the fastening gasket is an anti-skid surface.

18. The structure with a screw of claim 1, wherein the through hole comprises a first hole segment and a second hole segment, wherein a diameter of the first hole segment is smaller than a diameter of the second hole segment, and a stepped surface between the first hole segment and the second hole segment forms the abutting step.

19. A screw fixing structure, comprising a limiting structure, an assembly member, an elastic member and a screw, wherein the limiting structure is connected to the assembly member and provided with an operating hole, the assembly member is provided with a through hole for accommodating the screw and the elastic member, an abutting step is provided in the through hole, an end of the elastic member abuts against the abutting step and another end of the elastic member abuts against the screw, a shank portion of the screw is connected to a to-be-assembled member, and a head portion of the screw has an operating portion and an abutting portion; and
    when the shank portion of the screw is disconnected from the to-be-assembled member, the elastic member pushes the screw towards the limiting structure so that the abutting portion abuts against the limiting structure, and the operating portion is exposed through the operating hole.

20. The screw fixing structure of claim 19, wherein the abutting portion and the operating portion constitute a step structure, and in at least one direction perpendicular to an axial direction of the shank portion of the screw, a length of the abutting portion is greater than a diameter of the operating hole or a diameter of an incircle of the operating hole.

21. A display device, comprising a display panel, a to-be-assembled member and a screw fixing structure, wherein the screw fixing structure comprises a limiting structure, an assembly member, an elastic member and a screw, wherein the limiting structure is connected to the assembly member and provided with an operating hole, the assembly member is provided with a through hole for accommodating the screw and the elastic member, an abutting step is provided in the through hole, an end of the elastic member abuts against the abutting step and another end of the elastic member abuts against the screw, a shank portion of the screw is connected to a to-be-assembled member, and a head portion of the screw has an operating portion and an abutting portion; and when the shank portion of the screw is disconnected from the to-be-assembled member, the elastic member pushes the screw towards the limiting structure so that the abutting portion abuts against the limiting structure, and the operating portion is exposed through the operating hole; and
    the to-be-assembled member is provided with a threaded hole, and the screw and the threaded hole are in a threaded engagement.

* * * * *